United States Patent
Ben-Menahem et al.

(10) Patent No.: US 10,962,298 B2
(45) Date of Patent: Mar. 30, 2021

(54) TWO-PHASE THERMODYNAMIC SYSTEM HAVING A POROUS MICROSTRUCTURE SHEET TO INCREASE AN AGGREGATE THIN-FILM EVAPORATION AREA OF A WORKING FLUID

(71) Applicant: MICROSOFT TECHNOLOGY LICENSING, LLC, Redmond, WA (US)

(72) Inventors: Shahar Ben-Menahem, Mountain View, CA (US); Tzu-Yuan Lin, San Jose, CA (US); Michael Nikkhoo, Saratoga, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 91 days.

(21) Appl. No.: 16/147,416

(22) Filed: Sep. 28, 2018

(65) Prior Publication Data
US 2020/0103176 A1 Apr. 2, 2020

(51) Int. Cl.
*F28F 7/00* (2006.01)
*F28D 15/02* (2006.01)
(Continued)

(52) U.S. Cl.
CPC ....... *F28D 15/0266* (2013.01); *F28D 15/046* (2013.01); *H05K 7/20381* (2013.01)

(58) Field of Classification Search
CPC .............. F28D 15/0266; F28D 15/046; H05K 7/20381
(Continued)

(56) References Cited

U.S. PATENT DOCUMENTS 5,070,702 A * 12/1991 Jackson .................. F25B 9/002
62/610
6,167,948 B1 1/2001 Thomas
(Continued)

FOREIGN PATENT DOCUMENTS

CN 103687455 A 3/2014
CN 104634148 A 5/2015
(Continued)

OTHER PUBLICATIONS

Bonner III, Richard W., "Dropwise Condensation in Vapor Chambers", In Proceedings of 26th Annual IEEE Semiconductor Thermal Measurement and Management Symposium, Feb. 21, 2010, 4 Pages.
(Continued)

*Primary Examiner* — Davis D Hwu
(74) *Attorney, Agent, or Firm* — Newport IP, LLC; Mike R. Cicero

(57) ABSTRACT

A two-phase thermodynamic system includes a porous microstructure sheet to increase an aggregate thin-film evaporation area of a working fluid. The porous microstructure sheet may be disposed at a liquid-vapor boundary of the working fluid. The porous microstructure sheet has "micro" pores through which the working fluid flows from a liquid flow path on one side of the porous microstructure sheet to a vapor flow path on the other side of the porous microstructure sheet. Individual pores induce the working fluid to form thin-film evaporation regions. The porous microstructure sheet may have a pore density so as to increase an aggregate thin-film evaporation area of the working fluid. In this way, the overall thermal resistance across all liquid-vapor interfaces (menisci) of the working fluid is substantially decreased over conventional vapor chamber.

9 Claims, 5 Drawing Sheets

(51) Int. Cl.
*F28D 15/04* (2006.01)
*H05K 7/20* (2006.01)

(58) Field of Classification Search
USPC ........................................................ 165/80.4
See application file for complete search history.

(56) References Cited

U.S. PATENT DOCUMENTS

| | | | |
|---|---|---|---|
| 6,843,308 B1* | 1/2005 | Duval | F28D 15/0233 |
| | | | 165/104.26 |
| 8,991,194 B2* | 3/2015 | Edwards | F25B 21/02 |
| | | | 62/3.6 |
| 9,147,633 B2 | 9/2015 | Eid et al. | |
| 2003/0062149 A1* | 4/2003 | Goodson | F28D 15/00 |
| | | | 165/104.11 |
| 2003/0085024 A1* | 5/2003 | Santiago | B01D 19/0031 |
| | | | 165/104.11 |
| 2005/0034842 A1* | 2/2005 | Huber | C01B 5/00 |
| | | | 165/80.4 |
| 2007/0107875 A1 | 5/2007 | Lee et al. | |
| 2010/0252237 A1 | 10/2010 | Hashimoto et al. | |
| 2013/0133871 A1 | 5/2013 | Ma et al. | |
| 2014/0096940 A1* | 4/2014 | Thomas | F28F 13/00 |
| | | | 165/104.26 |
| 2016/0187070 A1 | 6/2016 | Yang et al. | |
| 2016/0216042 A1 | 7/2016 | Bozorgi et al. | |
| 2018/0202723 A1 | 7/2018 | Huang et al. | |

FOREIGN PATENT DOCUMENTS

| | | |
|---|---|---|
| CN | 106524092 A | 3/2017 |
| CN | 106992161 A | 7/2017 |

OTHER PUBLICATIONS

"International Search Report and Written Opinion Issued in PCT Application No. PCT/US2019/039114", dated Sep. 4, 2019, 11 Pages.

"International Search Report and Written Opinion Issued in PCT Application No. PCT/US19/039127", dated Sep. 12, 2019, 11 Pages.

"Non Final Office Action Issued in U.S. Appl. No. 16/352,633", dated Jul. 27, 2020, 6 Pages.

* cited by examiner

TWO-PHASE THERMODYNAMIC SYSTEM HAVING A POROUS MICROSTRUCTURE SHEET TO INCREASE AN AGGREGATE THIN-FILM EVAPORATION AREA OF A WORKING FLUID

BACKGROUND

Heat pipes and vapor chambers can be efficient tools for absorbing and dissipating heat that is emitted from external sources located adjacent to designated evaporator regions. The absorbed heat causes a working fluid to evaporate from a liquid phase into a vapor phase which stores the absorbed heat in latent form at a slightly lower temperature. The vapor phase of the working fluid then flows to condenser regions, where it condenses back into the liquid phase, causing the stored latent heat to be released and dissipated into an ambient environment. The condensed liquid is returned back to the evaporator regions, for instance via capillary forces and pressure gradients, so as to continue this cycle. Due to the thermodynamically spontaneous phase-change processes of evaporation and condensation respectively absorbing and releasing latent heat, heat pipes and vapor chambers behave as highly efficient passive thermal conductors so long as evaporator regions remain adequately wetted.

Various wicking structures have been designed that exploit capillary action to continuously absorb liquid into various solid structures as it condenses at the condenser regions, and to then draw the absorbed liquid back to the evaporator regions. Exemplary wicking structures include channel-type wicking structures that are etched into the inner surfaces of the vapor chamber to induce capillary forces that draw the liquid back to the evaporator regions. Unfortunately, channel-type wicking structures are not designed to decrease the overall thermal resistance across all liquid-vapor interfaces (menisci) at evaporation regions of the device. For example, although efficient at returning liquid to evaporation regions, channel-type wicking structures are not suited for increasing a thin-liquid-film evaporation area within the evaporation regions. This is because the channel-type wicking structures typically include relatively wide channels (e.g., 100 microns or more) so as not to unduly increase fluid resistance that restricts liquid flow from the condenser region to the evaporator region. Thus, a majority of the liquid-vapor boundary that is formed within such channel-type wicking structures will be an intrinsic meniscus region—which has a relatively higher thermal resistance than thin-film evaporation regions.

It is with respect to these and other considerations that the disclosure made herein is presented.

SUMMARY

Technologies described herein provide a two-phase thermodynamic system that includes a porous microstructure sheet to increase an aggregate thin-film evaporation area of a working fluid. Generally described, embodiments disclosed herein include a porous microstructure sheet that is disposed at a liquid-vapor boundary of a working fluid that is contained within the two-phase thermodynamic system. The porous microstructure sheet includes a plurality of pores through which the working fluid flows from a liquid flow path on one side of the porous microstructure sheet to a vapor flow path on the other side of the porous microstructure sheet. Individual pores induce the working fluid to form thin-film evaporation regions. In various embodiments, the porous microstructure sheet has a pore density (e.g., a number of pores per unit area) that is optimized so as to increase an aggregate thin-film evaporation area of the working fluid. It can be appreciated that increasing the pore density may be accomplished by decreasing the size (e.g., dimensions) of the individual pores or decreasing the spacing in between the individual pores, or both.

By appropriately sizing and spacing the individual pores, the overall thermal resistance across all liquid-vapor interfaces (menisci) of the working fluid is substantially decreased over conventional vapor chambers that merely incorporate channel-type wicking structures for wicking the condensed liquid back to the evaporator region. Thus, the technologies described herein enable two-phase thermodynamic systems (e.g., heat pipes, vapor chambers, etc.) to transmit latent heat across the liquid-vapor interface at substantially higher rates than conventional systems. This enables the two-phase thermodynamic systems disclosed herein to exploit phase-change processes for maximizing thermal conductivity at higher throughput heat power rates than conventional systems.

In an exemplary embodiment, a thermodynamic system includes walls that form a cavity which contains a working fluid in two phases (i.e., a liquid phase and a vapor phase). During operation, the liquid phase of the working fluid absorbs heat that is generated and/or transferred by a heat source that is external to the device. In some instances, the heat source may be physically touching a portion of the walls of the thermodynamic system. The absorbed heat continually converts mass of the working fluid from the liquid phase into the vapor phase, which then transfers this heat in latent form away from the heat source. Specifically, inside the cavity is an evaporator region or regions for absorbing heat to convert a liquid fraction of the working fluid into a vapor fraction of the working fluid. The working fluid may be a bi-phase fluid that evaporates from a liquid state into a gaseous (vapor) state upon absorbing latent heat. The working fluid may then flow through the cavity, in the vapor state, to carry the absorbed latent heat away from the evaporator region. Exemplary working fluids include, but are not limited to, water, refrigerant substances (e.g., R134), ammonia-based liquids, or any other fluid suitable for efficient absorption and release of heat to effect phase changes (evaporation and condensation respectively) change a liquid and a gaseous (vapor) state.

Inside the cavity there is also a condenser region or regions for releasing the latent heat out of the working fluid and expelling this released heat into an external environment. This release of latent heat occurs via spontaneous condensation wherein the vapor fraction is continually converted back into the liquid fraction. It will be appreciated by those skilled in the art that the specific amount (e.g., mass) of the vapor fraction that condenses back into the liquid fraction in any given time interval of operation depends on the specific amount of latent heat that is dissipated from the vapor fraction. It will also be appreciated that in steady state operation, this mass amount is equal to the mass amount of liquid fraction that is evaporated (converted into the vapor phase) during an equal duration of time. It will further be appreciated that in steady-state operation, the total heat power flowing into all evaporator region(s) from the external source(s) will be equal to the total heat power flowing out of all condenser region(s) into the external environment.

The thermodynamic system may include a vapor flow path through which the vapor fraction of the working fluid convectively carries the latent heat absorbed at the evaporator region(s) away from the heat source. The vapor flow path may be any path suitable for the vapor fraction of the working fluid to freely flow from the evaporator region(s) to the condenser region(s). The thermodynamic system may also include a liquid flow path through which the liquid fraction of the working fluid continuously flows back to the evaporator region(s) near the heat source. Thus, the liquid flow bath may extend from the condenser region(s) to the evaporator region(s). In some embodiments, the liquid flow path may include a plurality of ribs that form channels extending from the condenser region(s) back to the evaporator region(s). The channels fill up (at least partially) with the liquid fraction as it condenses at the condenser region(s). The channels then draw this liquid fraction back to the evaporator region (e.g. via capillary action). It can be appreciated that the channels form a wicking structure that exploits capillary action to ensure the evaporator region remains sufficiently wetted by continually drawing the liquid fraction back into the evaporator region—ideally at sufficient rates to keep up with evaporation.

The thermodynamic system may include a porous microstructure sheet that forms a boundary between the liquid flow path and the vapor flow path. For example, in embodiments where the liquid flow path is generally defined by the channels, the porous microstructure sheet may be disposed over the plurality of ribs that form the channels. The porous microstructure sheet includes a plurality of pores that individually induce the liquid fraction of the working fluid to form thin-film evaporation regions. A pore density of the porous microstructure sheet may be sufficiently high such that an aggregate thin-film evaporation area of the working fluid is increased—as compared to conventional systems. For example, it can be appreciated that near where a liquid-vapor boundary nears a solid material (e.g., metal), a liquid may form into one or more distinctively behaving regions. These distinctively behaving regions may include an adsorbed layer region, an thin-film evaporation region, and an intrinsic meniscus region. It can be appreciated that a relative rate at which the liquid fraction evaporates into the vapor fraction will be greatest at the thin-film evaporation region(s), as compared to the adsorbed layer region and the intrinsic meniscus region of the liquid-vapor boundary. Since the pore density of the porous microstructure sheet is sufficiently high such that an aggregate thin-film evaporating area of the working fluid is increased as compared to conventional systems, the technologies described herein are suitable for increasing the number and robustness of low-thermal-resistance microscopic evaporation sites for uninterrupted optimum performance.

In various embodiments, the porous microstructure sheet may be in the form of a grid mesh in which the individual pores are repeatably arranged into an ordered grid of pores having defined pore sizes and/or pore shapes. As a specific but nonlimiting example, the individual pores may include four sides which come together to form four interior corners. These "microscopic" interior corners may individually induce the formation of thin-film evaporation regions of the liquid fraction. Furthermore, since the liquid-vapor boundary may be located within the individual pores, thin-film evaporation regions may also form away from the corners on the individual sides of each pore. Thus, even away from corners, each side (edge) of each grid block shaped pore will also function as an evaporator site as evaporation is relatively higher via thin-film evaporation regions of a liquid as opposed to other "deeper" regions of the liquid (e.g., where in intrinsic meniscus region forms).

In some embodiments, the porous microstructure sheet may be formed by converting a metallic foil into a grid mesh by etching the plurality of pores into the metallic foil. It can be appreciated that various dry etching techniques facilitate the formation of microstructures having relatively high aspect ratio. For example, various dry etching techniques enable the formation of deep "pin" holes type microstructures.

In some embodiments, the porous microstructure sheet may be formed by weaving a plurality of metallic fibers together so that individual metallic fibers are interconnected with other metallic fibers to form the plurality of pores. As a specific but nonlimiting example, the weave of metallic fibers may include a first array of metallic fibers that extend in a first direction and a second array of metallic fibers that extend in a second direction. The first array of metallic fibers may be weaved together with the second array of metallic fibers.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical to refer to each individual item. Generic references to the items may use the specific reference number without the sequence of letters.

DETAILED DESCRIPTION

The following Detailed Description describes a two-phase thermodynamic system that includes a porous microstructure sheet that is specifically designed to induce a working fluid to form numerous thin-film evaporation sites to increase an aggregate thin-film evaporation area of the working fluid. Generally described, various embodiments disclosed herein include a porous microstructure sheet that is disposed at or near a liquid-vapor boundary of the working fluid. The porous microstructure sheet includes a plurality of pores through which the working fluid flows from a liquid flow path on one side of the porous microstructure sheet to a vapor flow path on the other side of the porous microstructure sheet. Individual pores induce the working fluid to form thin-film evaporation regions and the porous microstructure sheet may have a pore density that is optimized so as to increase an aggregate thin-film evaporation area of the working fluid. In this way, the overall thermal resistance across all liquid-vapor interfaces (menisci) of the working fluid is substantially decreased over conventional vapor chambers (e.g., vapor chambers that merely incorporate channel-type wicking structures for wicking the condensed liquid back to the evaporator region(s)).

Thus, the technologies described herein enable two-phase thermodynamic systems (e.g., heat pipes, vapor chambers, etc.) to transmit latent heat across the liquid-vapor interface at substantially higher rates than conventional systems. Additionally, substantially increasing the number of robust evaporation sites that are present within an evaporator region(s) results in the two-phase thermodynamic systems disclosed herein being substantially more resistant to dry-out. This enables the two-phase thermodynamic systems disclosed herein to exploit phase-change processes for maximizing thermal conductivity at higher throughput heat power rates than conventional systems.

The present invention is believed to be applicable to a variety of two-phase thermodynamic systems and approaches involving the utilization of porous microstructure sheet(s) to increase an aggregate thin-film evaporation area of a working fluid. Aspects of the invention disclosed below are predominantly described in the context of a single porous microstructure sheet being disposed over a channel-type wicking structure so that the porous microstructure sheet is located at and/or induces the formation of a liquid-vapor boundary. While the present invention is not necessarily limited to such embodiments, an appreciation of various aspects of the invention is best gained through a discussion of examples in this context. Accordingly, aspects of the disclosure below that are not expressly recited in the claims are not to be interpreted as limiting of the claims in any way whatsoever.

Figure 1A:
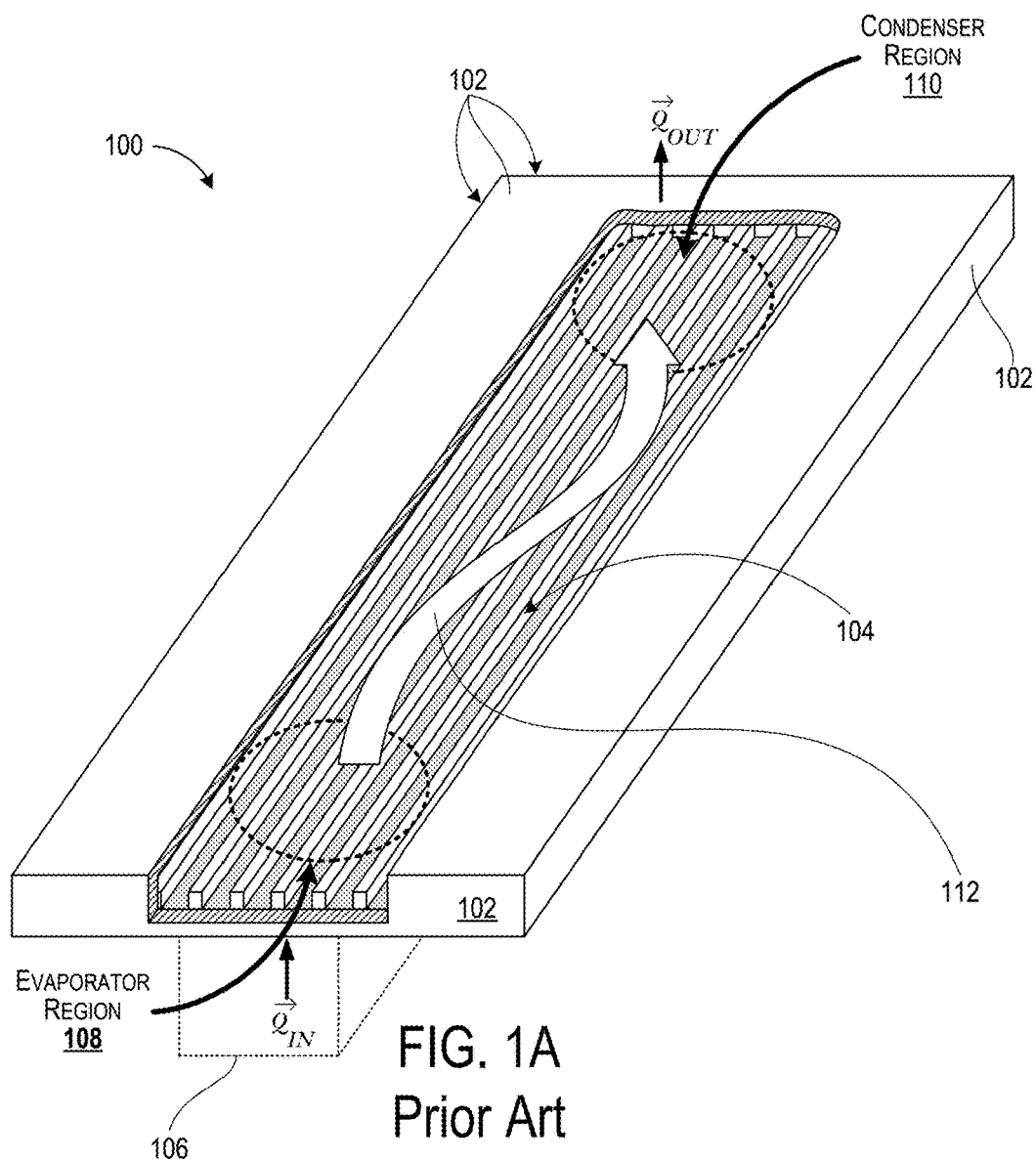
FIG. 1A is a perspective cut-away view of a "prior art" two-phase thermodynamic system that includes a channel-type wicking structure to continually induce newly condensed fluid to flow from a condenser region toward an evaporator region.

FIG. 1A is a perspective cut-away view of a "prior art" two-phase thermodynamic system 100 that includes a channel-type wicking structure 104 to induce fluid flow from a condenser region 110 and an evaporator region 108. As illustrated, the thermodynamic system 100 includes walls 102 that contain a working fluid (omitted from illustration to expose the channel-type wicking structure 104). During operation, a heat source 106 (e.g., a Central Processing Unit, a battery, etc.) emits heat that is absorbed into the working fluid at the evaporator region 108 (as shown by the $\vec{Q}_{IN}$ symbol) of the thermodynamic system 100. The absorbed heat causes a liquid fraction of the working fluid to evaporate into a vapor fraction of the working fluid. As additional mass (e.g. as quantified in gram units) of the liquid fraction is continually evaporated into the vapor fraction, some mass of the vapor fraction is displaced towards the condenser region 110. Thus, as additional heat is absorbed into the working fluid converting the liquid fraction into the vapor fraction, latent heat is carried by the vapor fraction through a vapor flow path 112 (shown as a white arrow disposed above the channel-type wicking structure 104) to the condenser region 110. Then, when the vapor fraction reaches the condenser region 110, the latent heat is transferred out of the working fluid (as shown by the $\vec{Q}_{OUT}$ symbol) via a combination of condensation phase change (converting the vapor fraction of the working fluid back into its liquid fraction) and conductive heat transfer out of the device and into the external environment adjacent to the outer device wall in the vicinity of the condenser region.

As the latent heat is released from the condenser region 110 (e.g., through the walls 102 and into the ambient environment), the channel-type wicking structure 104 continually wicks or draws the newly condensed portions of the liquid fraction back into the evaporator region 108. Although somewhat useful for drawing the liquid fraction back into the evaporator region 108, the channel-type wicking structure 104 Is not useful for inducing the formation of large numbers of robust (e.g., dry-out resistant) thin-film evaporation sites. The undesirable quantity and geometry of the evaporation sites produced by the channel-type wicking structure 104 all too often leads to dry-out occurring within the evaporator region 108. Dry-out is a phenomenon wherein the liquid fraction of the working fluid evaporates too fast as heat is absorbed, thereby causing the evaporator region to "dry-out." Dry-out can lead to high localized temperature rises or spikes and, therefore, extreme temperature non-uniformity across the thermodynamic system 100.

Figure 1B:
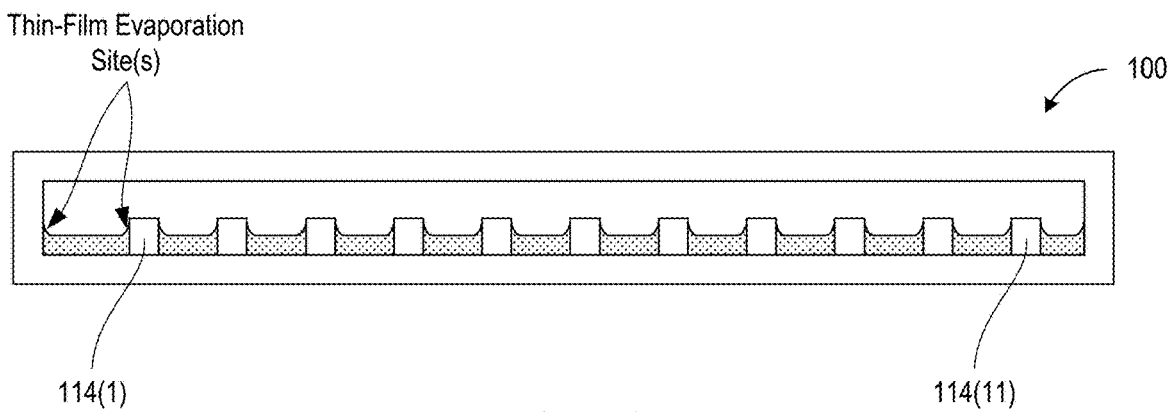
FIG. 1B is a side view of the "prior art" two-phase thermodynamic system of FIG. 1A that illustrates the formation of only two thin-film evaporation sites within each individual channel of the channel-type wicking structure.

FIG. 1B is a side view of the "prior art" two-phase thermodynamic system 100 that illustrates the formation of thin-film evaporation sites within the channel-type wicking structure 104. As illustrated, the thermodynamic system 100 includes eleven ("11") individual ribs 114 (only the first rib 114(1) and the eleventh rib 114(11) are labelled) that together with the side walls form twelve ("12") individual channels through which the liquid fraction of the working fluid is drawn into the evaporator region 108. It can be appreciated that since the thin-film evaporation sites will form where the liquid-vapor boundary nears a solid structure (e.g., the ribs 114 and/or the interior side of the walls 102), in the illustrated example the inner geometry of the thermodynamic system 100 will induce the formation of twenty-four ("24") thin-film evaporation region. Specifically, so long as the level of the working fluid (shown with a dotted fill pattern) remains below the top of the ribs 114, then a single thin-film evaporation region will form against each side of each individual channel.

Figure 2:
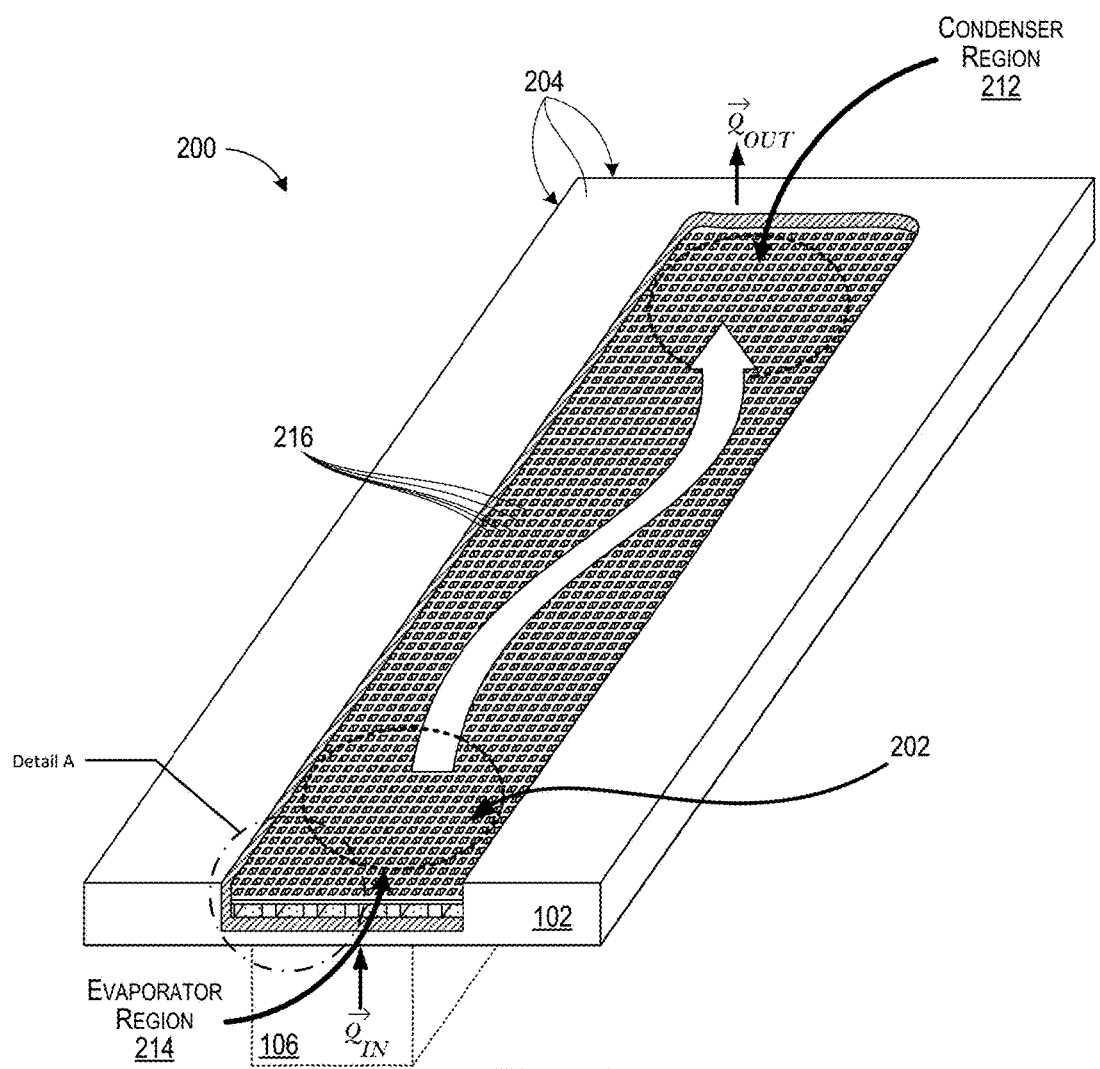
FIG. 2 illustrates an exemplary two-phase thermodynamic system that includes a porous microstructure sheet to induce the formation of numerous thin-film evaporation sites to increase an aggregate thin-film evaporation area of a working fluid.
Figure 3:
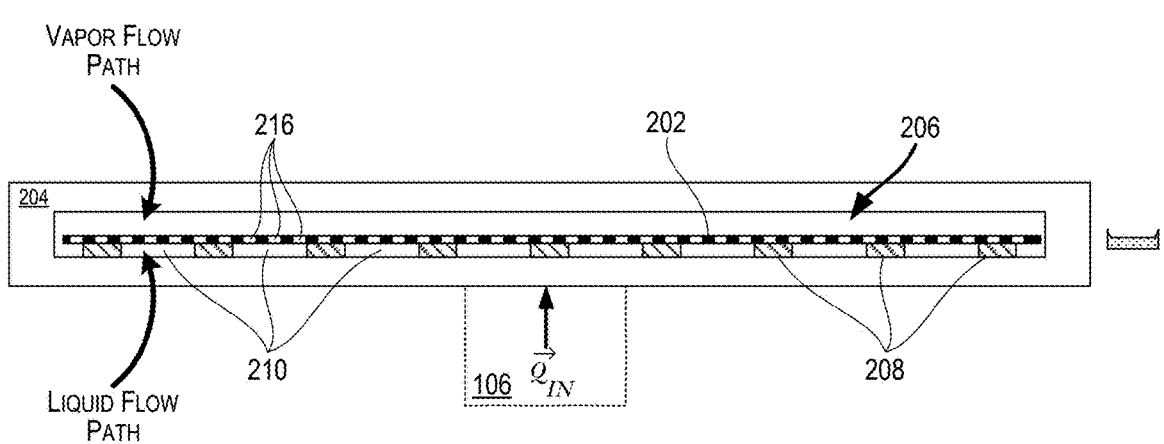
FIG. 3 illustrates a side view of the two-phase thermodynamic system of FIG. 2.

Turning now to FIG. 2, illustrated is an exemplary two-phase thermodynamic system 200 that includes a porous microstructure sheet 202 to induce the formation of numerous thin-film evaporation sites (also referred to herein as "thin-film evaporation regions") to increase an aggregate thin-film evaporation area of a working fluid. FIG. 3 illustrates a side view of the two-phase thermodynamic system 200 of FIG. 2. As illustrated, the thermodynamic system 200 includes walls 204 that form a cavity 206 (labelled only in FIG. 3). The cavity 206 contains the working fluid in two phases (i.e., a liquid phase and a vapor phase). It is worth noting that in order to expose the structural details of the porous microstructure sheet, the working fluid is omitted from both of FIGS. 2 and 3. During operation, the liquid phase of the working fluid absorbs heat that is generated and/or transferred by a heat source 106 that is external to walls 204 of the two-phase thermodynamic system 200. As described above, the absorbed heat continually converts mass of the working fluid from the liquid phase into the vapor phase. The vapor phase then transfers this heat in latent form away from the heat source 106.

In the illustrated example, the two-phase thermodynamic system 200 includes a plurality of ribs 208 that together form a plurality of channels 210. The channels 210 form a liquid flow path through which the liquid phase of the working fluid flows from a condenser region 212 back to an evaporator region 214. The channels 210 induce capillary action on the liquid fraction of the working fluid to draw the liquid fraction toward the evaporator region 214.

In the illustrated embodiment, the porous microstructure sheet 202 is disposed over the top of the ribs 208 to induce the liquid fraction of the working fluid to form thin-film evaporation regions. Specifically, the porous microstructure sheet 202 includes a plurality of individual pores 216 that may be specifically shaped so as to cause thin-film evaporation regions to be formed therein. In this way, if the cavity 206 is filled with an appropriate amount of the working fluid such that a liquid-vapor boundary forms slightly above the ribs 208, then small amounts of the liquid fraction will be drawn into individual ones of the pores 216 and caused to form thin-film evaporation regions. It can be appreciated therefore that the porous microstructure sheet 202 may be disposed substantially at the liquid-vapor boundary such that the vapor flow path is on one side of the porous microstructure sheet 202 (e.g., above the sheet as shown in FIGS. 2 and 3) and the liquid flow path is on the opposite side of the porous microstructure sheet 202 (e.g., below the sheet as shown in FIGS. 2 and 3).

The porous microstructure sheet 202 may have a pore density that is optimized so as to increase an aggregate thin-film evaporation area of the working fluid—as compared to the amount of thin-film evaporation area that would form due to the channel-type wicking structure alone (e.g., as described in relation to FIGS. 1A and 1B). It should be appreciated that inclusion of the porous microstructure sheet 202 at (or near) a liquid-vapor boundary within the two-phase thermodynamic system 200 may substantially decrease the overall thermal resistance across all liquid-vapor interfaces (menisci) of the working fluid. Thus, the porous microstructure sheet 202 may enable the two-phase thermodynamic system 200 to transmit latent heat across the liquid-vapor interface at substantially higher rates than conventional systems and, therefore, exploit phase-change processes for maximizing thermal conductivity at higher throughput heat power rates than conventional systems.

In various embodiments, the individual pores 216 within the porous microstructure sheet 202 may be "microscopic" in size. As some specific but nonlimiting examples, the individual pores 216 may have a total pore area of: less than 2500 square microns ($\mu$) (e.g., as would be formed by a 50$\mu$ by 50$\mu$ square pore), less than 2025 square microns ($\mu$) (e.g., as would be formed by a 45$\mu$ by 45$\mu$ square pore), less than 1600 square microns ($\mu$) (e.g., as would be formed by a 40$\mu$ by 40$\mu$ square pore), less than 1225 square microns ($\mu$) (e.g., as would be formed by a 35$\mu$ by 35$\mu$ square pore), less than 900 square microns ($\mu$) (e.g., as would be formed by a 30$\mu$ by 30$\mu$ square pore), less than 625 square microns ($\mu$) (e.g., as would be formed by a 25$\mu$ by 25$\mu$ square pore), less than 400 square microns ($\mu$) (e.g., as would be formed by a 20$\mu$ by 20$\mu$ square pore), less than 225 square microns ($\mu$) (e.g., as would be formed by a 15$\mu$ by 15$\mu$ square pore), or less than 100 square microns ($\mu$) (e.g., as would be formed by a 10$\mu$ by 10$\mu$ square pore).

Figure 4:
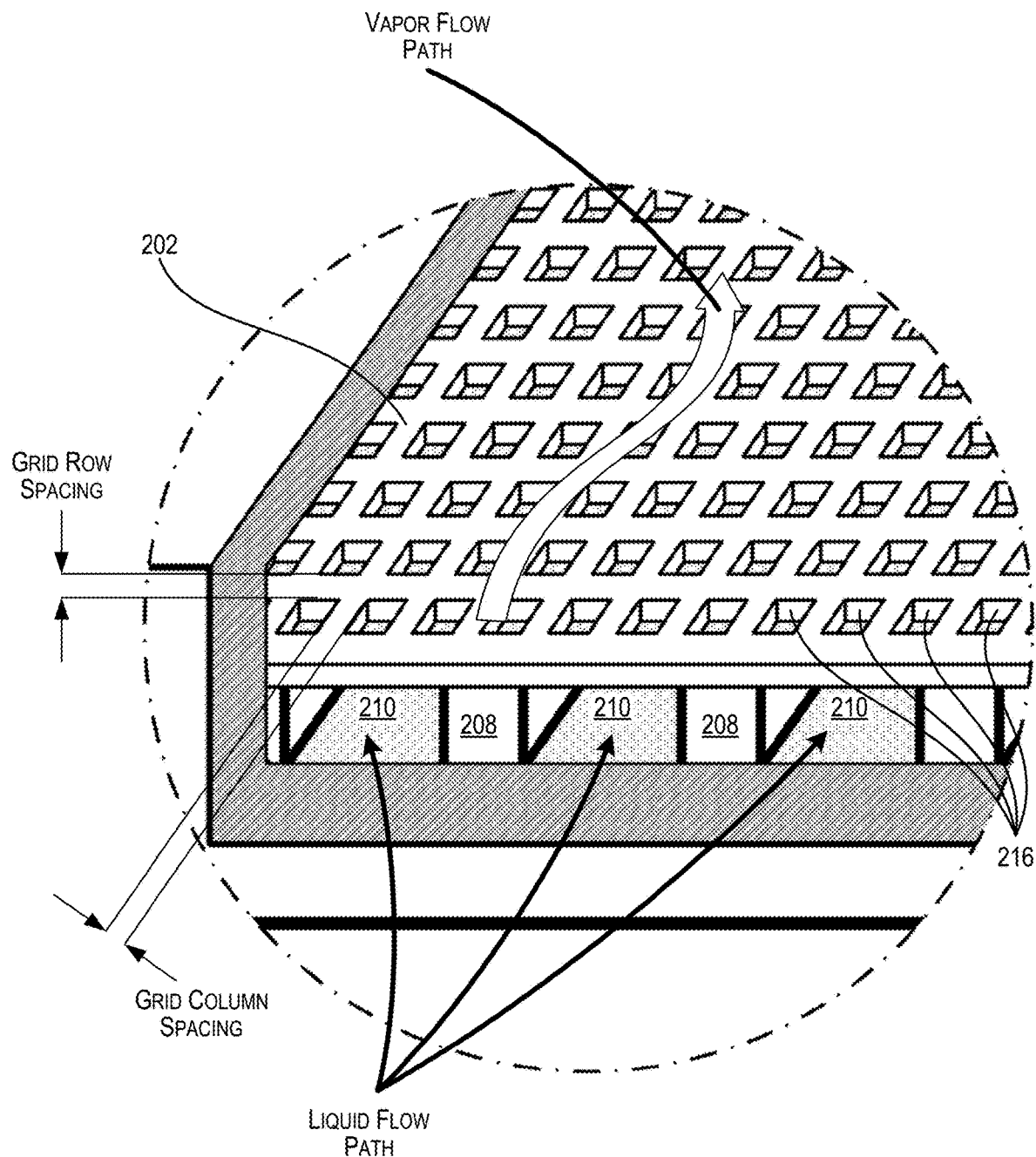
FIG. 4 illustrates a detailed view of the two-phase thermodynamic system that corresponds to the particular section labelled "Detail A" in FIG. 2. The working fluid intentionally omitted from FIG. 4 for the purpose of fully revealing the structure of the two-phase thermodynamic system.

Turning now to FIG. 4, illustrated is a detailed view of the two-phase thermodynamic system 200 of FIG. 2. The detailed view shown in FIG. 2 specifically corresponds to the circle that is labeled Detail A in FIG. 2. In the illustrated example, the porous microstructure sheet 202 is in the form a grid mesh in which the individual pores 216 are repeatedly arranged into an ordered grid of pores having predefined and/or repeatable pore sizes. For example, as illustrated, the individual pores 216 are arranged into ordered columns and rows of pores. In this example, the individual rows of pores are separated from one another by a predefined and repeatable grid row spacing whereas the individual columns of pores are separated from one another by a predefined and repeatable grid column spacing. In some implementations, the grid row spacing may be nominally equal to the grid column spacing. In some implementations, the grid row spacing may be nominally different from the grid column spacing. In some implementations, the "nominal" grid row spacing and/or the grid column spacing may be between 50 microns and 40 microns, between 40 microns and 30 microns, between 30 microns and 20 microns, between 20 microns and 10 microns, or less than 10 microns.

In the illustrated example, the individual pores include four sides which come together to form four interior corners. As described in more detail below in relation to FIG. 7, individual thin-film evaporation regions may be formed within these interior corners. Furthermore, since the liquid-vapor boundary may be located within the individual pores, thin-film evaporation regions may also form away from the corners on the individual sides of each pore. Thus, even away from corners, each side (edge) of each grid block will also function as an evaporator site as evaporation is relatively higher via thin-film evaporation regions of a liquid as opposed to other "deeper" regions of the liquid. It can be appreciated from FIG. 4 that since the individual pores 216 and interior corners thereof are much more numerous than the individual sides of the ribs 208, the number of thin-film evaporation regions that are formed within the two-phase thermodynamic system 200 will be substantially greater than would be formed within the "prior art" system 100 described in relation to FIGS. 1A and 1B. It can further be appreciated that although those thin-film evaporation regions that would be formed against the ribs of the system 100 individually be larger than those formed within the individual pores 216, the aggregate area of the thin-film evaporation regions formed against the ribs of the system 100 will be substantially less than the aggregate are of the thin-film evaporation regions formed within the porous microstructure sheet 202.

It can be appreciated from FIG. 4 that in embodiments in which the porous microstructure sheet 202 is disposed over the top of ribs 208 that form channels 210, the width and/or height of the individual pores may be substantially less than the width of the individual channels 210. In some implementations, the individual channels 210 span a width that is at least twice as long as the width of the individual pores 216. As a specific but nonlimiting example, the individual pores 216 may be substantially square pores that sides that span 50 microns (or less) while the individual channels 210 may span 100 microns (or more). As another specific but nonlimiting example, the individual pores 216 may span 40 microns (or less) while the individual channels 210 may span 100 microns (or more). As another specific but non-limiting example, the individual pores 216 may span 30 microns (or less) while the individual channels 210 may span 100 microns (or more). As another specific but non-limiting example, the individual pores 216 may span 20 microns (or less) while the individual channels 210 may span 100 microns (or more).

In some embodiments, the porous microstructure sheet illustrated in FIGS. 2 through 4 is formed by etching the individual pores 216 into a metallic foil sheet. It can be appreciated that various dry etching techniques facilitate the formation of microstructures having relatively high aspect ratio. For example, various dry etching techniques enable the formation of deep "pin" holes type microstructures. An exemplary such dry-etching technique may include, but is not limited to, reactive-ion etching which is commonly used in microfabrication. In addition to dry etching techniques, any other manufacturing technique that is suitable for forming the plurality of pores 216 into a metallic foil may also be deployed to form the porous microstructure sheet 202.

Figure 5:
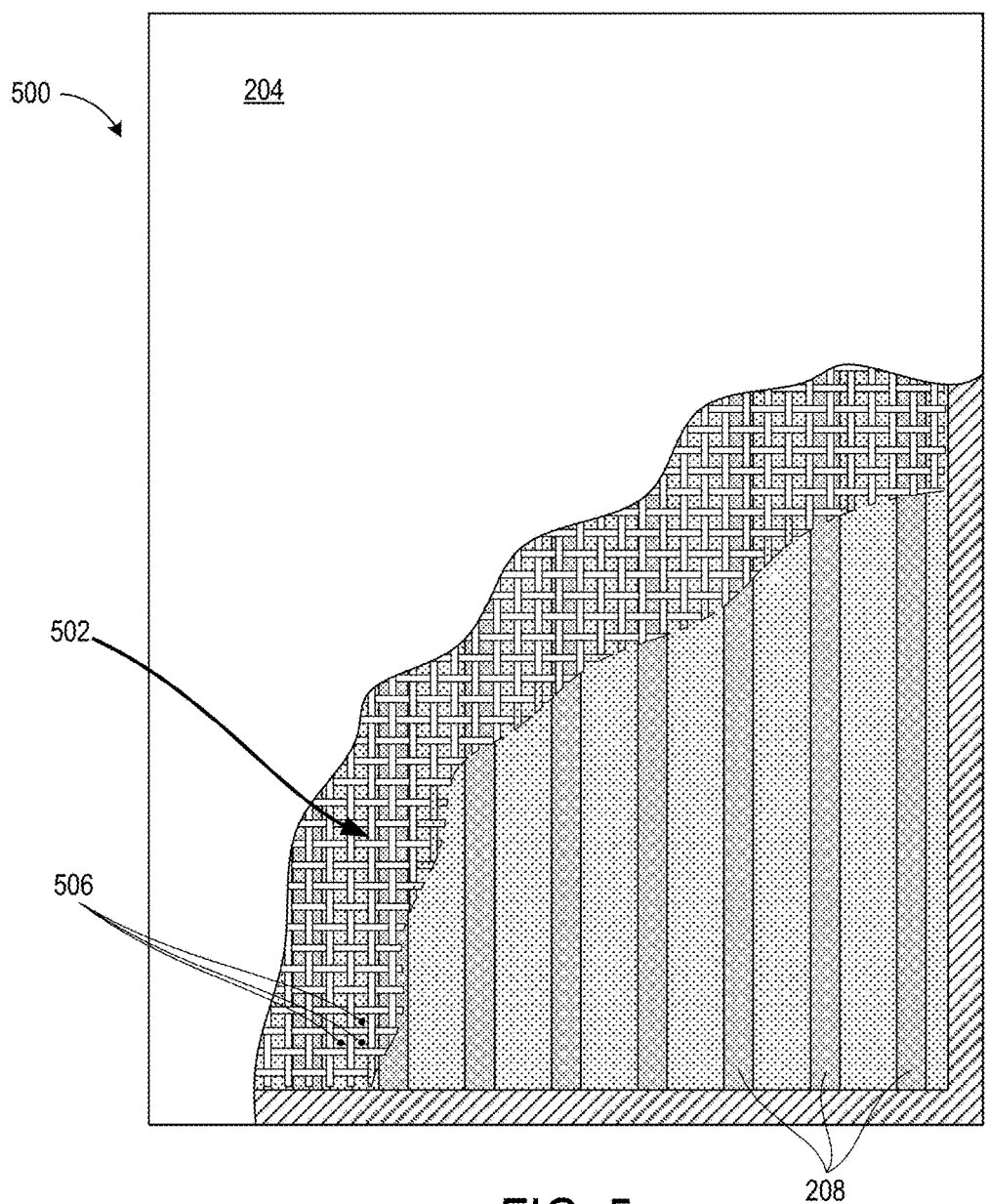
FIG. 5 illustrates a top view of an alternative embodiment of the two-phase thermodynamic system which has a porous microstructure sheet that is formed by a plurality of metallic fibers that are interwoven together.

Turning now to FIG. 5, illustrated is top view of an exemplary two-phase thermodynamic system 500 that includes a porous microstructure sheet 502 that is formed by a plurality of metallic fibers 504. More specifically, the porous microstructure sheet 502 is formed by weaving the plurality of metallic fibers 504 together so that individual metallic fibers 504 are interconnected with other metallic fibers 504 to form a plurality of pores 506. In various embodiments, the "weave" of metallic fibers 504 includes multiple different arrays of metallic fibers 504 that extend in multiple different directions. In the specific but nonlimiting example illustrated in FIG. 5, the "weave" of metallic fibers 504 that makes up the porous microstructure sheet 502 includes a first array of metallic fibers 504 that extend in a first direction (illustrated vertically) and a second array of metallic fibers that extend in a second direction (illustrated horizontally). In this example, individual pores 506 are formed by the weaved combination of four individual metallic fibers 504.

It can be appreciated that in FIG. 5 a portion of the wall 204 is cut-away to reveal an inner portion of the two-phase thermodynamic system 500. It can further be appreciated that a relatively smaller portion of the porous microstructure sheet 504 is also cut-away to reveal an unobstructed top view of a channel-type wicking structure that is formed by a plurality of ribs 208. Thus, the two-phase thermodynamic system 500 is generally similar to the two-phase thermodynamic system 200 with that the porous microstructure sheet 502 is formed from a "weave" of interconnected metallic fibers 504 whereas the porous microstructure sheet 202 is formed by cutting, stamping, etching, or otherwise adding pores to a metallic foil sheet.

Figure 6:
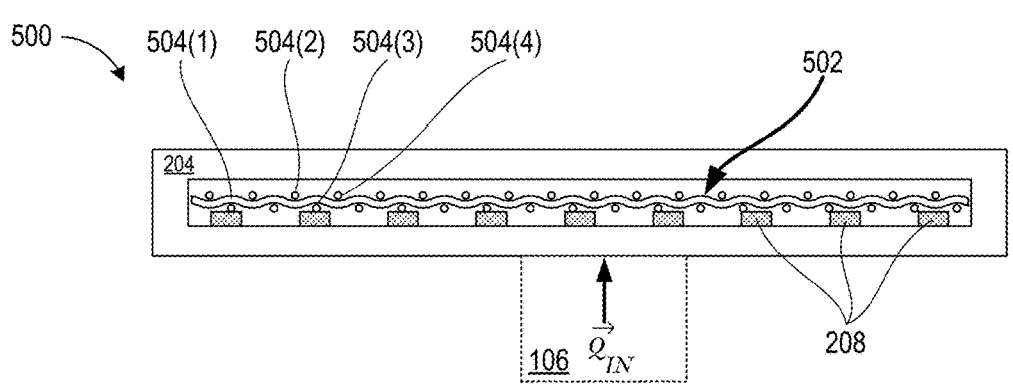
FIG. 6 is a side view of the two-phase thermodynamic system of FIG. 5 which further illustrates how the individual metallic fibers may be woven together.

FIG. 6 is a side view of the two-phase thermodynamic system 500 of that further illustrates the individual metallic fibers 504 being woven together. The side view of FIG. 6 is taken at a cross section that corresponds to a first metallic fiber 504(1). In the illustrated example, the first metallic fiber 504(1) is woven underneath a second metallic fiber 504(2), and then over the top of a third metallic fiber 504(3), and then underneath a fourth metallic fibers, and so on. In some embodiments, the individual metallic fibers 504 of the porous microfiber sheet 502 are interconnected at predetermined and repeatable intervals. As a specific but non-limiting example, the individual metallic fibers 504 may be interconnected at predefined and repeatable spacings.

It can be appreciated that in embodiments in which a porous microstructure sheet (e.g., 202 and/or 502) is disposed directly over a channel-type wicking structure, some portion of the working fluid may become trapped between the top of the individual ribs 208 and the porous microstructure sheet. This results in this "trapped" portion of the working fluid becoming inactive (e.g., "dead") in the sense that it ceases to participate in the heat dissipation action that is desired of the two-phase thermodynamic system. In order to mitigate this unfortunate phenomenon, in various embodiments of the two-phase thermodynamic system disclosed herein the porous microstructure sheet is welded to the top of the individual ribs 208. It can be appreciated that by welding the porous microstructure sheet to the "shoulder" (e.g., top) of the individual ribs, the amount of the working fluid that becomes "dead" (e.g., trapped) may be minimized. In this way, a smaller amount of the bi-phase fluid will be needed to achieve a desired amount of heat dissipation ability.

Figure 7:
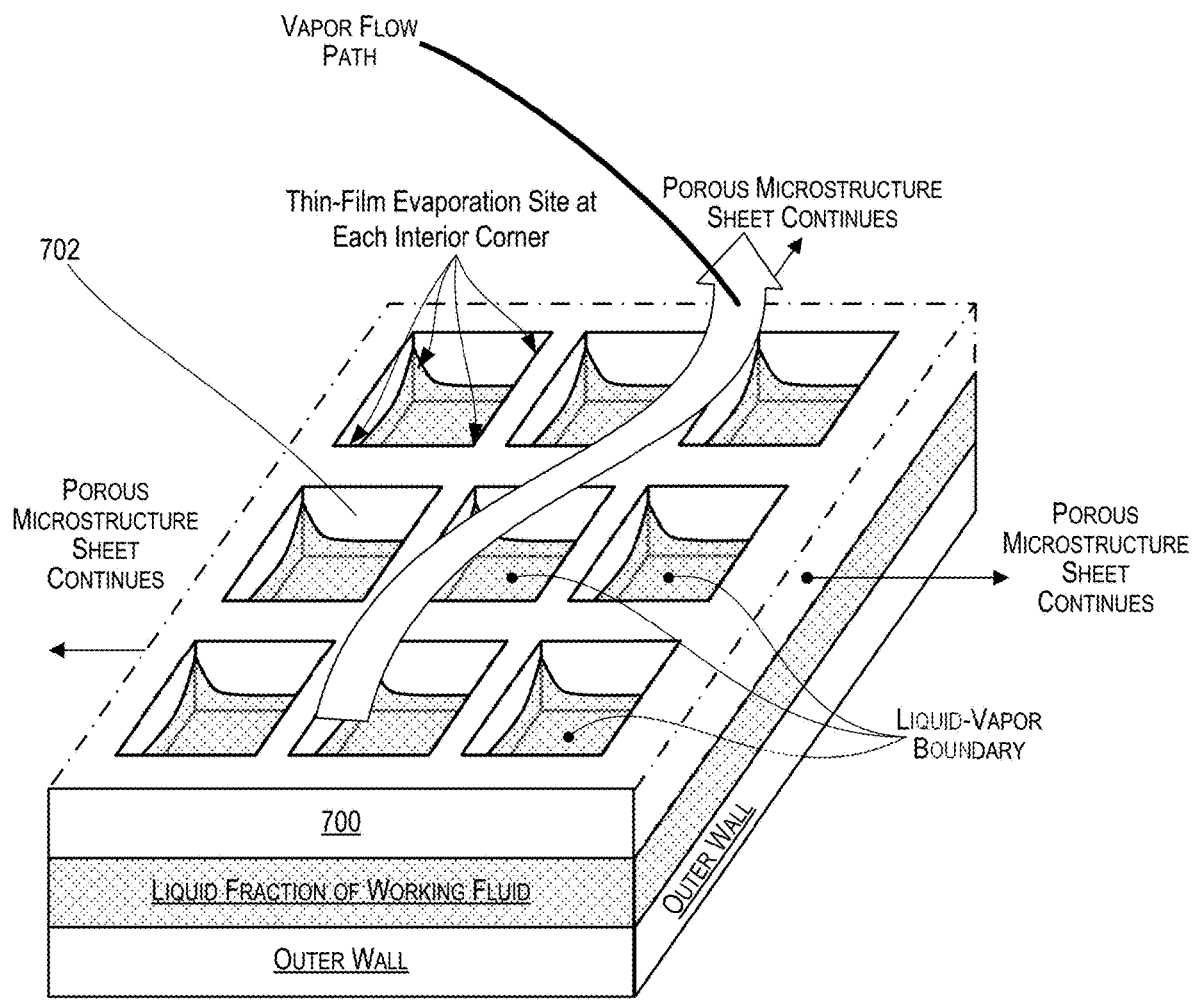
FIG. 7 illustrates an enlarged view of an exemplary porous microstructure sheet in which the individual pores are rectangular in shape and in which thin-film evaporation regions of the working fluid are shown to be formed within the interior corners of the individual pores.

Turning now to FIG. 7, illustrated is an enlarged view of an exemplary porous microstructure sheet 700 in which the individual pores 702 are rectangular in shape and in which thin-film evaporation regions of the working fluid are shown to be formed within the interior corners of the individual pores. As illustrated, the individual pores 702 are arranged according to an ordered grid of pores (e.g., an arrangement of pores having rows or pores and columns of pores). The exemplary microporous microstructure sheet 700 is illustrated as being disposed at a liquid-vapor boundary of the working fluid. Specifically, a liquid fraction of the working fluid is shown as being disposed underneath the porous microstructure sheet 700 and above an outer wall. In this way, disposed underneath the porous microstructure sheet 700 is a liquid flow path through which the illustrated liquid fraction of the working fluid is able to return from the condenser region (not shown in FIG. 7) to the evaporator region (also not shown in FIG. 7). It should be appreciated that FIG. 7 omits one or more outer walls which form the cavity and that these outer walls are omitted in order to provide an adequate and uncluttered view of the thin-film evaporation sites being formed within the porous microstructure sheet.

As further illustrated, a small portion of the liquid fraction of the working fluid collects within the individual corners of the individual pores 702. It will be appreciated by those skilled in the art that the liquid fraction will form thin-film evaporation regions within the corners. Thus, under conditions in which the liquid-vapor boundary is disposed within the individual pores of the porous microstructure sheet 700, thin-film evaporation regions may form at each of the interior corners of the pores. For individual pores as illustrated that have four interior corners, at least four thin-film evaporation regions will form within each of the individual pores. Furthermore, the size of the individual pores may be specifically sized such that a substantial fraction of the liquid-vapor boundary is formed into a "thin-film" in the sense that that fraction has a relatively lower thermal resistance than other fractions of the liquid-vapor boundary. In this way, by spacing the individual pores closely together with a relatively small separation between pores (e.g., 10 microns, 20 microns, etc.), the aggregate area of the liquid-vapor boundary that is induced to forming into a thin-film may be substantially increased over conventional vapor chambers and heat pipes. It can further be appreciated that the relatively small size of the thin-film evaporation regions formed within the porous microstructure sheets described herein will have increased (e.g., smaller radii) meniscus curvatures as compared to conventional vapor chambers. The increased meniscus curvatures will, in turn, will increase the resistance of most evaporation sites to dry-out at higher heat-power through-put levels (especially when transient).

Although illustrated as highly ordered structure (with regular inter-pore channels—not shown in Figures), one skilled in the art will recognize that the porous microstructure sheet may also include pores as randomly interconnected structures such as, for example, openings in a wire mesh, or to high-aspect-ratio liquid regions between solid fibers in a fibrous-bundle wick component. Those skilled in the art will further recognize that term "pore" may also refer to void volumes between grains in a sintered-metal-powder wick component that are partially filled with liquid. Thus, in various embodiments, the porous microstructure sheet may be in the form of a wire mesh sheet and/or a sintered metal-power sheet that is disposed over the top of a channel-type wicking structure.

EXAMPLE CLAUSES

The disclosure presented herein may be considered in view of the following clauses.

Example Clause A, a thermodynamic system, comprising: one or more walls forming a sealed cavity that contains a bi-phase fluid, the bi-phase fluid having at least a vapor fraction and a liquid fraction; a plurality of ribs forming channels that extend from an evaporator region of the sealed cavity to a condenser region of the sealed cavity, the evaporator region for absorbing heat into the bi-phase fluid to convert the liquid fraction into the vapor fraction, the condenser region for dissipating the heat out of the bi-phase fluid to convert the vapor fraction into the liquid fraction; and a porous microstructure sheet disposed over the plurality of ribs to form a boundary between a liquid flow path, that is defined by the channels, and a vapor flow path, wherein the porous microstructure sheet includes a plurality of pores that individually induce the liquid fraction to form one or more thin-film evaporation regions.

Example Clause B, the thermodynamic system of Example Clause A, wherein individual pores of the plurality of pores span a first width and wherein individual channels of the plurality of channels span a second width that is at least twice the first width.

Example Clause C, the thermodynamic system of any one of Example Clauses A through B, wherein the first width that the individual pores span is less than 50 microns and wherein the second width that the individual channels span is greater than 100 microns.

Example Clause D, the thermodynamic system of any one of Example Clauses A through C, wherein the porous microstructure sheet is formed from a metallic foil having a first side and a second side, and wherein individual pores of the plurality of pores extend from the first side to the second side.

Example Clause E, the thermodynamic system of any one of Example Clauses A through D, wherein the porous microstructure sheet includes a plurality of metallic fibers that are interconnected to form the plurality of pores.

Example Clause F, the thermodynamic system of any one of Example Clauses A through E, wherein the plurality of metallic fibers includes a first array of metallic fibers that extend in a first direction and a second array of metallic fibers that extend in a second direction that is different than the first direction.

Example Clause G, the thermodynamic system of any one of Example Clauses A through F, wherein the plurality of pores are arranged on the porous microstructure sheet to form an ordered grid of pores.

Example Clause H, the thermodynamic system of any one of Example Clauses A through G, wherein the porous microstructure sheet is a sintered-metal-powder sheet that is disposed over the plurality of ribs.

Example Clause I, the thermodynamic system of any one of Example Clauses A through H, wherein individual pores of the plurality of pores include at least three inner walls that intersect to form at least three interior corners that attract the liquid fraction to form corresponding pairs of thin-film evaporation regions.

Example Clause J, a thermodynamic system for increasing formation of thin-film evaporation regions of a bi-phase fluid, the thermodynamic system comprising: a plurality of walls forming a sealed cavity that contains a liquid fraction and a vapor fraction of the bi-phase fluid, the sealed cavity having an evaporator region for absorbing heat to convert the liquid fraction into the vapor fraction and a condenser region for dissipating the heat to convert the vapor fraction into the liquid fraction; a liquid flow path through which the liquid fraction flows from the condenser region to the evaporator region; a vapor flow path through which the vapor fraction flows from the evaporator region to the condenser region; and a porous microstructure sheet that is disposed at a boundary between the liquid flow path and the vapor flow path, wherein the porous microstructure sheet includes a plurality of pores at which the liquid fraction evaporates from the liquid flow path into the vapor fraction within the vapor flow path.

Example Clause K, the thermodynamic system of Example Clause J, further comprising a plurality of channels that induce capillary forces on the liquid fraction to bias movement of the liquid fraction from the condenser region to the evaporator region, wherein the porous microstructure sheet is mechanically coupled to a top end of the plurality of channels.

Example Clause L, the thermodynamic system of any one of Example Clauses J through K, wherein individual pores of the plurality of pores have interior sides that span a first distance, and wherein individual channels of the plurality of channels span a second distance that is at least three times the first distance.

Example Clause M, the thermodynamic system of any one of Example Clauses J through L, wherein the porous microstructure sheet is formed from at least one of: a metallic foil through which individual pores, of the plurality of pores, extend from a first side to a second side; or a plurality of metallic fibers that are interconnected to form the plurality of pores.

Example Clause N, the thermodynamic system of any one of Example Clauses J through M, wherein at least some individual pores of the plurality of pores each include multiple interior corners at which the liquid fraction is caused to form corresponding thin-film evaporation regions.

Example Clause O, the thermodynamic system of any one of Example Clauses J through N, wherein individual pores of the plurality of pores are arranged in an ordered grid having columns of pores and rows of pores.

Example Clause P, the thermodynamic system of any one of Example Clauses J through O, wherein individual pores of the plurality of pores are randomly arranged.

Example Clause Q, a thermodynamic system, comprising: a plurality of walls forming a sealed cavity that contains a liquid fraction and a vapor fraction of a bi-phase fluid, the sealed cavity having a liquid flow path through which the liquid fraction flows from a condenser region to an evaporator region, the sealed cavity having a vapor flow path through which the vapor fraction flows from the evaporator region to the condenser region; and a porous microstructure sheet disposed at a liquid-vapor boundary formed between the liquid fraction and the vapor fraction, the porous microstructure sheet having an ordered arrangement of pores through which the bi-phase fluid passes from the liquid flow path to the vapor flow path, wherein individual pores of the ordered arrangement of pores include a predetermined number of interior corners that induce the bi-phase fluid to form into thin-film evaporation regions.

Example Clause R, the thermodynamic system of Example Clause Q, further comprising a plurality of channels that extend from the condenser region to the evaporator region, wherein the porous microstructure sheet is disposed on top of the plurality of channels.

Example Clause S, the thermodynamic system of any one of Example Clauses Q through R, wherein the individual pores include at least four interior corners that induce the bi-phase fluid to form into the thin-film evaporation regions.

Example Clause T, the thermodynamic system of any one of Example Clauses Q through S, wherein the individual pores are rectangular pores that have a pore area of less than 1600 microns.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A thermodynamic system, comprising:
one or more walls forming a sealed cavity that contains a bi-phase fluid, the bi-phase fluid having at least a vapor fraction and a liquid fraction;
a plurality of ribs forming channels that extend from an evaporator region of the sealed cavity to a condenser region of the sealed cavity, the evaporator region for absorbing heat into the bi-phase fluid to convert the liquid fraction into the vapor fraction, the condenser region for dissipating the heat out of the bi-phase fluid to convert the vapor fraction into the liquid fraction; and
a porous microstructure sheet disposed over the plurality of ribs to form a boundary between a liquid flow path, that is defined by the channels, and a vapor flow path, wherein the porous microstructure sheet includes a plurality of pores that individually include an interior corner, that is formed by an intersection between two interior walls that intersect, to induce the liquid fraction to form one or more thin-film evaporation regions at a liquid-vapor boundary between the liquid fraction and the vapor fraction, wherein the liquid-vapor boundary resides within individual pores of the porous microstructure sheet.

2. The thermodynamic system of claim 1, wherein individual pores of the plurality of pores span a first width and wherein individual channels of the plurality of channels span a second width that is at least twice the first width.

3. The thermodynamic system of claim 2, wherein the first width that the individual pores span is less than 50 microns and wherein the second width that the individual channels span is greater than 100 microns.

4. The thermodynamic system of claim 1, wherein the porous microstructure sheet is formed from a metallic foil having a first side and a second side, and wherein individual pores of the plurality of pores extend from the first side to the second side.

5. The thermodynamic system of claim 1, wherein the plurality of pores are arranged on the porous microstructure sheet to form an ordered grid of pores.

6. The thermodynamic system of claim 1, wherein the porous microstructure sheet is a sintered-metal-powder sheet that is disposed over the plurality of ribs.

7. The thermodynamic system of claim 1, wherein individual pores of the plurality of pores include at least three inner walls that intersect to form at least three interior corners that attract the liquid fraction to form corresponding pairs of thin-film evaporation regions.

8. The thermodynamic system of claim 1, wherein individual pores of the plurality of pores include four walls that intersect to form four interior corners that attract the liquid fraction to form corresponding pairs of thin-film evaporation regions.

9. The thermodynamic system of claim 8, wherein the individual pores have a pore area of less than 1600 microns.

* * * * *